(12) United States Patent
Yoneda et al.

(10) Patent No.: US 10,096,570 B2
(45) Date of Patent: Oct. 9, 2018

(54) MANUFACTURING METHOD FOR POWER SEMICONDUCTOR DEVICE, AND POWER SEMICONDUCTOR DEVICE

(71) Applicant: Mitsubishi Electric Corporation, Chiyoda-ku, Tokyo (JP)

(72) Inventors: Yutaka Yoneda, Tokyo (JP); Junji Fujino, Tokyo (JP); Kazuyoshi Shige, Tokyo (JP); Yoichi Hironaka, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 0 days.

(21) Appl. No.: 15/568,130

(22) PCT Filed: May 31, 2016

(86) PCT No.: PCT/JP2016/065995
§ 371 (c)(1),
(2) Date: Oct. 20, 2017

(87) PCT Pub. No.: WO2016/199621
PCT Pub. Date: Dec. 15, 2016

(65) Prior Publication Data
US 2018/0151533 A1    May 31, 2018

(30) Foreign Application Priority Data
Jun. 11, 2015  (JP) .................................. 2015-117962

(51) Int. Cl.
*H01L 21/607*   (2006.01)
*H01L 23/00*    (2006.01)

(52) U.S. Cl.
CPC .............. *H01L 24/81* (2013.01); *H01L 24/11* (2013.01); *H01L 24/16* (2013.01); *H01L 24/27* (2013.01);
(Continued)

(58) Field of Classification Search
CPC ......... H01L 24/11; H01L 24/13; H01L 24/16; H01L 24/27; H01L 24/75; H01L 24/81;
(Continued)

(56) References Cited

U.S. PATENT DOCUMENTS 6,614,110 B1 * 9/2003 Pace ..................... H01L 21/485
216/2
9,818,716 B2 * 11/2017 Fujino ..................... H01L 24/45
(Continued)

FOREIGN PATENT DOCUMENTS

EP          1 703 554 A2    9/2006
JP        2003-45920 A      2/2003
(Continued)

OTHER PUBLICATIONS

International Search Report (PCT/ISA/210) dated Aug. 30, 2016, by the Japanese Patent Office as the International Searching Authority for International Application No. PCT/JP2016/065995.

*Primary Examiner* — Stephen W Smoot
(74) *Attorney, Agent, or Firm* — Buchanan Ingersoll & Rooney PC

(57) ABSTRACT

An object of the invention is to provide: a manufacturing method for a highly reliable power semiconductor device which prevents breakage of an conductor pattern and an insulating layer, and has bonding strength higher than that by the conventional bonding between the electrode terminal and the conductor pattern; and that power semiconductor device. Breakage of the conductor pattern and the insulating layer is prevented due to inclusion of: a step of laying an
(Continued)

electrode terminal on a protrusion provided on a conductor pattern placed on a circuit-face side of a ceramic board so that a center portion of a surface to be bonded of the electrode terminal makes contact with a head portion of the protrusion; a step of pressurizing and ultrasonically vibrating a surface opposite to the surface to be bonded, of the electrode terminal, using an ultrasonic horn, to thereby bond the electrode terminal to the conductor pattern.

19 Claims, 12 Drawing Sheets

(52) U.S. Cl.
  CPC ............... *H01L 2224/81191* (2013.01); *H01L 2224/81205* (2013.01); *H01L 2224/83205* (2013.01)

(58) Field of Classification Search
  CPC ........... H01L 24/83; H01L 2224/75252; H01L 2224/75305; H01L 2224/75353; H01L 2224/81191; H01L 2224/81205; H01L 2224/81206; H01L 2224/83205; H01L 2224/83206; H01L 2924/13055
  See application file for complete search history.

(56) References Cited

U.S. PATENT DOCUMENTS

| | | | |
|---|---|---|---|
| 2005/0110161 A1* | 5/2005 | Naito | H01L 24/81 257/778 |
| 2007/0108627 A1* | 5/2007 | Kozaka | H01L 23/49811 257/778 |
| 2009/0230172 A1* | 9/2009 | Ogashiwa | H01L 24/11 228/110.1 |
| 2010/0212153 A1* | 8/2010 | Roth | H01L 24/03 29/842 |
| 2013/0255878 A1* | 10/2013 | Takahashi | H05K 3/305 156/288 |
| 2015/0200176 A1* | 7/2015 | Mori | H01L 24/81 257/737 |

FOREIGN PATENT DOCUMENTS

| | | |
|---|---|---|
| JP | 2005-259880 A | 9/2005 |
| JP | 2006-253516 A | 9/2006 |
| JP | 2010-82668 A | 4/2010 |
| JP | 2014-56917 A | 3/2014 |

* cited by examiner

US 10,096,570 B2

MANUFACTURING METHOD FOR POWER SEMICONDUCTOR DEVICE, AND POWER SEMICONDUCTOR DEVICE

TECHNICAL FIELD

The present invention relates to a manufacturing method for a power semiconductor device by bonding an electrode terminal to a semiconductor element or the like, and that power semiconductor device, and in particular, relates to the manufacturing method for a power semiconductor device in which said bonding is performed by ultrasonic bonding, and that power semiconductor device.

BACKGROUND ART

In a conventional power semiconductor device, in particular, in a large-current power semiconductor device, its electrode terminal to be connected to an external circuit has to be bonded over a large area in order to cause a large current to flow therethrough efficiently, so that solder bonding has been used for bonding the electrode terminal (see, for example, Patent Document 1). However, as the temperature environment in which the power semiconductor device is used becomes more severe, a possibility arises that the conventional solder bonding may not satisfy the required reliability. Meanwhile, according to the conventional solder bonding, when the power semiconductor device has such a structure in which a ceramic board comprising a ceramic plate and conductor patterns formed on both surfaces of that plate is solder-bonded to a base plate, there is a possibility that the solder which bonds the base plate and the ceramic board together may be remelted by the application of heat at the time the electrode terminal is solder-bonded. For that reason, as the solder for bonding the electrode terminal, it is not allowed to use a solder whose melting point is close to that of the solder which bonds the base plate and the ceramic board together, and thus there is a problem that plural types of solders are required, resulting in complicated process.

As a method of solving these problems, there is a method in which the electrode terminal is ultrasonically bonded to the conductor pattern on the ceramic board. Since ultrasonic bonding is solid-phase bonding without requiring a heating step, it is possible, at the time of bonding the electrode terminal, to bond the electrode terminal over a large area without remelting the solder which bonds the base plate and the ceramic board together, and in addition, it is possible to improve the reliability of the bonding portion in comparison with that by solder bonding. Ultrasonic bonding is a technology for forming a bonding layer by ultrasonically vibrating the materials to be bonded together while applying a pressure to them, using an ultrasonic horn, thereby to remove an oxide film formed along the bonding interface and dirt adhered thereto, and to cause the newly developed surfaces to be tightly adhered to each other. Thus, it is thought that, at the time of bonding, the conductor pattern causes stress concentration and is broken at around the bonding portion of the conductor pattern. In the semiconductor device, at the time of operation, the current that flows in the semiconductor element is flowing in the conductor pattern through the bonding portion from the electrode terminal, and thus, there is a risk that if the conductor pattern is broken, this may result in no current flowing in the semiconductor device. Further, although it is common that the conductor pattern is formed integrally with an insulating layer so as to prevent a current from flowing on the heat dissipation surface of the semiconductor device, if the conductor pattern is broken, the insulating layer formed integrally with that conductor pattern will also be broken at the same time. This causes a risk of not ensuring the insulation property of the product, and is thus very dangerous.

In this respect, for dealing with this problem, in Patent Document 2, such a structure is disclosed in which a resin layer is provided between a terminal end portion and a conductor pattern. Accordingly, in the vicinity of the end of the electrode terminal, a soft member is present between the terminal and the conductor pattern, so that the terminal end portion and the conductor pattern are prevented from making direct contact with each other at the time of ultrasonic bonding, and thus the pressure acting on the conductor pattern is reduced. This makes it possible to restrict the conductor pattern from being broken, so that the bonding can be performed while increasing the applied pressure.

Further, such a method is conceivable in which a condition for bonding is made mild, to thereby prevent breakage of the conductor pattern and the insulating layer. However, if the condition for bonding is made mild, a problem arises that the bonding strength of the bonding portion decreases. For dealing with this problem, in Patent Document 3, such a structure is disclosed in which, as an electrode terminal, a copper member is used that has projections on its end surface to be bonded to the conductor pattern, each having a projection height at least equal to or more than the thickness of the oxide film produced on the surface of the other side, and that is adjusted to have a hardness higher than that of the conductor pattern. Because the projections are provided on the end surface to be bonded of the electrode terminal, the projections will slide on the surface of the other-side member to break/split the oxide film, to thereby make direct contact with the intrinsic surface under that film. In this state, when ultrasonic vibration is further applied continuously, plastic flow occurs in the surface to be bonded of the electrode terminal including portions of the projections. This broadens the mutually adhering portions of the metal intrinsic surfaces, so that the electrode terminal and the other-side member are ultrasonically bonded to each other with a sufficient bonding strength and without being subject to influence by the oxide film.

CITATION LIST

Patent Document

Patent Document 1: Japanese Patent Application Laid-open No. 2006-253516 (Paragraph 0012, FIG. 1)
Patent Document 2: Japanese Patent Application Laid-open No. 2010-082668 (Paragraph 0013, FIG. 1)
Patent Document 3: Japanese Patent Application Laid-open No. 2005-259880 (Paragraph 0008, FIG. 1)

SUMMARY OF THE INVENTION

Problems to be Solved by the Invention

However, according to Patent Document 2, in a region where the soft member is present, no bonding portion is formed between the electrode terminal and the conductor pattern, so that the resultant bonding portion becomes smaller than the size of the electrode terminal. Further, there is a concern that the soft member may be broken by ultrasonic bonding to remain in the bonding portion, to thereby constitute a factor of decreasing the bonding strength. Meanwhile, according to Patent Document 3, since the copper member adjusted to have a hardness higher than that of the conductor pattern is used, there is a concern that the projections may not deform at the time of the bonding to dig into the conductor pattern, to thereby break the conductor pattern and the insulating layer even though the bonding condition has been made mild.

This invention has been made to solve the problems as described above, and an object thereof is related to a semiconductor device in which an electrode terminal is ultrasonically bonded to a conductor pattern on an insulating layer, and is to provide: a manufacturing method for a highly reliable power semiconductor device which prevents breakage of the conductor pattern and the insulating layer without using a resin layer, and has a bonding strength higher than that by the conventional bonding between the electrode terminal and the conductor pattern; and that power semiconductor device.

Means for Solving the Problems

A manufacturing method of a power semiconductor device according to the invention is comprising: a step in which an electrode terminal is laid on a protrusion that is provided on an electrode layer and that has a hardness lower than that of the electrode terminal so that a part of a surface to be bonded that is placed on a back-surface side of the electrode terminal makes contact with a head portion of the protrusion; and a step in which the electrode terminal and the electrode layer are bonded together in such a manner that the protrusion deforms preferentially due to a pressure and ultrasonic vibration applied thereto by an ultrasonic horn from a front-surface side of the electrode terminal.

Effect of the Invention

According to the invention, using the head portion of the protrusion provided on the electrode layer, said layer and the electrode terminal are ultrasonically bonded together, so that it is possible to prevent the electrode layer, etc. from being broken due to stress concentration caused by the applied pressure at the time of application of the ultrasonic wave.

MODES FOR CARRYING OUT THE INVENTION

Figure 1A:
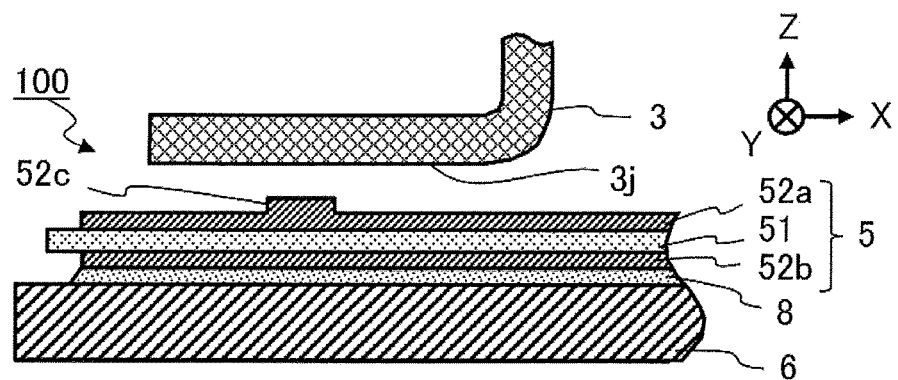
FIG. 1A and FIG. 1B area partial cross-sectional view and a top view for illustrating a configuration before bonding of a main part of a power semiconductor device according to Embodiment 1 of the invention.

Hereinafter, power semiconductor devices as embodiments of the invention will be described with reference to the figures. Note that, in the respective figures, the same reference numerals are given to the same or similar configuration parts. In the illustrations in the respective figures, the sizes and scales of corresponding configuration parts are independent from each other and thus, for example, such a case may arise where, in the cross-sectional views in a relation that the configuration in one of them is partly changed from that in the other one, with respect to illustrations of unchanged common configuration parts, the sizes and the scales of that common configuration parts are different to each other. Further, each of the power semiconductor devices is actually configured to include other plural components; however, for the purpose of simplifying the description, only the parts necessary for the description will be stated, so that the other parts (for example, a power semiconductor element, a casing, and the like) will be omitted from the description.

Embodiment 1

Figure 1B:
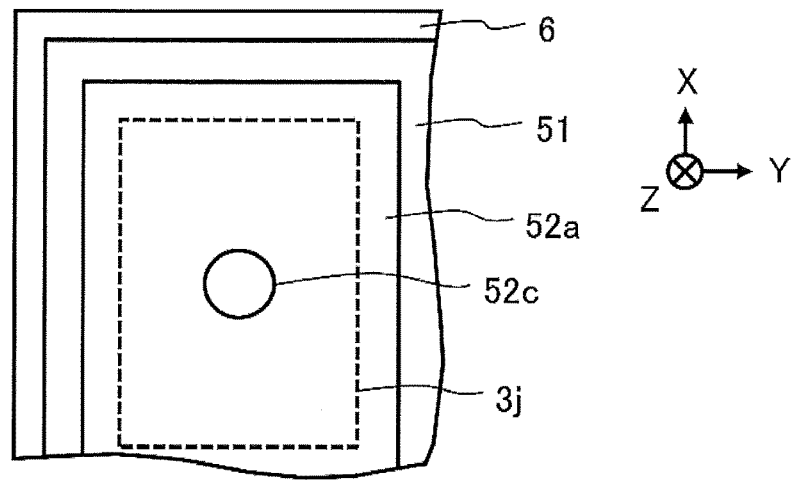

FIG. 1A and FIG. 1B are a partial cross-sectional view and a top view, respectively, showing a configuration before bonding of a main part of a power semiconductor device 100 according to Embodiment 1 of the invention. As shown in FIG. 1A and FIG. 1B, the power semiconductor device 100 according to Embodiment 1 of the invention includes: a ceramic board 5 which is an insulating board comprising a ceramic base member 51 and conductor patterns 52a, 52b formed as electrode layers on both surfaces of that member; a heat dissipation member 6; an electrode terminal 3; and the like. The heat dissipation member 6 is bonded by a solder 8 to the heat-dissipation face side (the conductor pattern 52b-side) of the ceramic board 5, and the electrode terminal 3 is ultrasonically bonded to the circuit-face side thereof (the conductor pattern 52a-side). The electrode terminal 3 is electrically connected to a main electrode of a power semiconductor element 1. In the following, description will be made in detail. Note that, in each of the figures, a coordinate system is shown, in which, an x-direction is a direction that is parallel to the ceramic board 5 and along which the bonding portion of the electrode terminal 3 extends; a z-direction is a direction perpendicular to the ceramic board 5; and a y-direction is a direction perpendicular to the plane of the paper. The x-direction, the y-direction and the z-direction of the coordinate system are orthogonal to each other.

The electrode terminal 3 is a wiring member for electrically connecting the conductor pattern 52a provided as an electrode layer of the ceramic board 5, with an external circuit. As the material of the electrode terminal 3, a metal having a small electric resistance is preferable, and in general, a product cut out of a metal sheet made of Cu, Al or the like, or a press worked product thereof, is used. With respect to the electrode terminal 3, on one end side thereof, the bonding portion where the electrode terminal is connected to the conductor pattern 52a is formed, and the other side thereof is electrically connected to another circuit component or the external circuit. Further, with respect to the electrode terminal 3, in order to increase an allowable current to flow, it is preferable that the sectional area of the electrode terminal 3 be as large as possible; however, it is preferable that the thickness thereof be as thinner as possible, in order to make the applied power at the time of ultrasonic bonding, easier to be transferred to a surface to be bonded 3j. Accordingly, the thickness of the plate member for forming the electrode terminal 3 or the thickness of at least the portion having the surface to be bonded 3j facing the conductor pattern 52a, is preferably about 0.5 mm to 2.0 mm, and the width thereof is preferably about 2.0 to 6.0 mm.

The ceramic board 5 comprises the ceramic base member 51 and the conductor patterns 52a, 52b formed on both surfaces of the ceramic base member 51. The ceramic base member 51 is an electrical insulator and is preferable to have a large thermal conductivity, so that a ceramic plate of AlN, SiN, $Al_2O_3$ or the like, having a thickness of 0.635 mm or 0.32 mm, is generally used therefor. For the conductor patterns 52a, 52b, the same material is generally used. Of these, the conductor pattern 52a for forming the bonding portion together with the electrode terminal 3 is preferably made of a metal having a small electric resistance, because it is a wiring member for electrically connecting the power semiconductor element and the external circuit together. Thus, as the conductor patterns 52a, 52b, Cu, Al or the like, having a thickness of about 1.0 mm or less is generally used. Further, at least one protrusion 52c is provided in the area of the surface of the conductor pattern 52a to be ultrasonically bonded at least to the surface to be bonded 3j of the electrode terminal 3. The protrusion 52c is formed by machining, etching or the like. For example, the protrusion 52c according to Embodiment 1 has a head shape which is a circular column shape with a diameter of 2.0 mm, and has a height of 0.1 mm.

The heat dissipation member 6 is bonded by the solder 8 to one or plural ceramic boards 5 and serves itself as a heat dissipation plate, and in addition, a surface of the heat dissipation member 6 that is opposite to its surface bonded by the solder 8 is connected to a heatsink using a thermal grease, etc. Thus, heat generated in the power semiconductor device is efficiently dissipated to the outside. Accordingly, as the material of the heat dissipation member 6, a metal having a large thermal conductivity is preferable, and in general, a metal plate made of Cu, Al, AlSiC or the like, having a thickness of about 1 to 5 mm, is used therefor.

The solder 8 bonds together the heat-dissipation surface side of the ceramic board 5 and the heat dissipation member 6. Accordingly, as the material of the solder 8, a metal having a low melting point and a large thermal conductivity is preferable, and in general, an alloy using Sn, Pb, Ag, Cu or the like, is used. Further, from the aspect of reliability and heat-dissipation capability, its thickness is preferably about 0.1 mm to 0.3 mm.

Figure 2A:
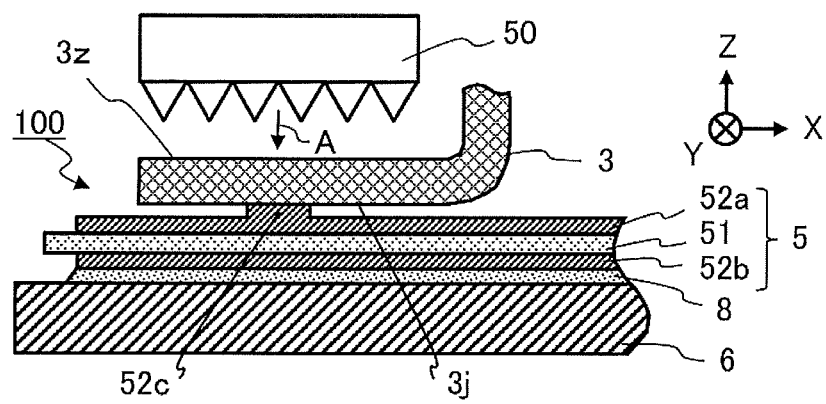
FIG. 2A, FIG. 2B and FIG. 2C are cross-sectional views of a region where a conductor pattern and an electrode terminal are bonded together, at respective steps, for illustrating a manufacturing method for a main part of the power semiconductor device according to Embodiment 1 of the invention.
Figure 2B:
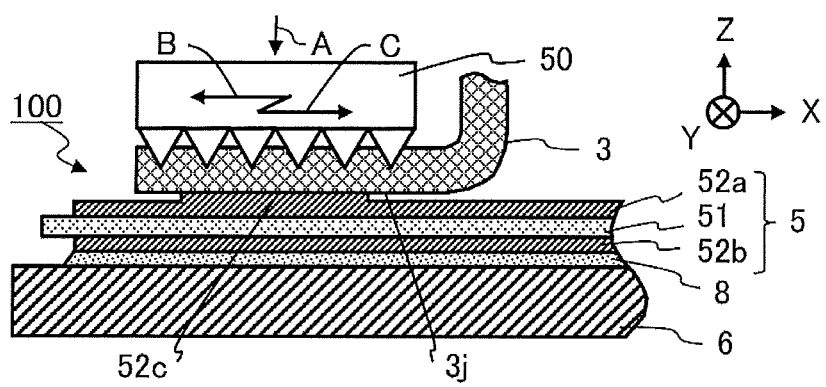
Figure 2C:
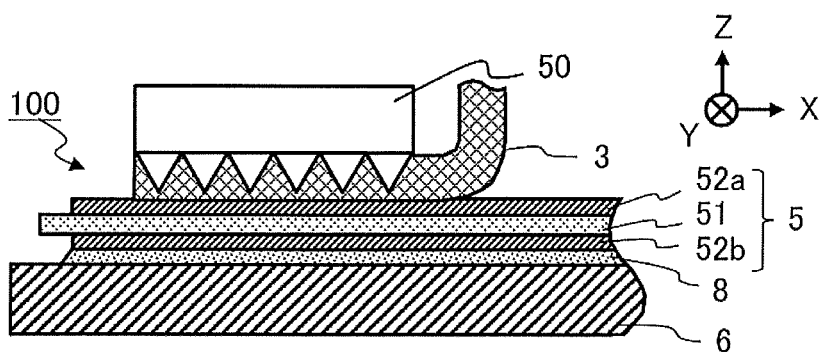

Next, description will be made about a manufacturing method for a main part of the power semiconductor device 100 according to Embodiment 1 of the invention. FIG. 2A, FIG. 2B and FIG. 2C are diagrams showing manufacturing steps for the main part of the power semiconductor device 100 according to Embodiment 1 of the invention.

First of all, as shown in FIG. 2A, the electrode terminal 3 is laid on the protrusion 52c provided on the conductor pattern 52a so that the surface to be bonded 3j makes contact with the protrusion 52c. At this time, an entire power semiconductor device in the middle of assembly is fixed to an unshown ultrasonic bonding apparatus, so that in the figure, only parts of the electrode terminal 3 and the conductor pattern 52a are illustrated. Then, an ultrasonic horn 50 is lowered in A-direction (Z-axis direction) so that its head makes contact with a surface 3z opposite to the surface to be bonded 3j, of the electrode terminal 3, at its specified position. At this time, in order to develop the effect by the protrusion 52c to the maximum extent, it is preferable that the center of the head of the ultrasonic horn 50 be lowered to a position matched to the center of the protrusion 52c. Here, because the surfaces of the electrode terminal 3 and the protrusion 52c are each covered with a bonding-inhibiting film such as an oxide film or the like, or something like that, the electrode terminal 3 and the protrusion 52c is never bonded to each other.

Then, as shown in FIG. 2B, the ultrasonic horn 50 is pressurized against the electrode terminal 3 and is further ultrasonically vibrated in B and C directions (X-axis direction). The frequency at this time is, for example, several tens of kHz, and the ultrasonic horn 50 is lowered in A direction while being vibrated. Accordingly, the contacting faces of the protrusion 52c and the electrode terminal 3 rub each other, so that the bonding-inhibiting film such as an oxide film or the like, or something like that, which covers each of the contacting faces, is removed. Projection portions of the ultrasonic horn 50 dig into portions of the surface 3z opposite to the surface to be bonded 3j, of the electrode terminal 3. As bonding further proceeds, in the order from the surface of the protrusion 52c to another portion, they are going to bonded to the electrode terminal 3, while the protrusion 52c deforms, in particular, in the vibration directions, due to the applied pressure and the vibration given by the ultrasonic horn 50, so that the bonded area expands centering around the protrusion 52c and thus the end portion of the bonding portion moves toward the outer side of the electrode terminal 3.

Lastly, as shown in FIG. 2C, the protrusion 52c disappears after deformation, and mutually contacting faces of the conductor pattern 52a and the electrode terminal 3 are bonded to each other due to ultrasonic vibration, so that a strong bonding layer is formed. On this occasion, as described previously, the surface of the protrusion 52c is firstly bonded, and starting therefrom, the electrode terminal 3 and the conductor pattern 52a are going to be bonded together, so that the bonded area increases as bonding proceeds, and in accordance therewith, the stress due to the applied pressure decreases. Thus, it is possible to prevent the conductor pattern 52a and the ceramic base member 51 from being broken due to stress concentration caused by the applied pressure at the time of application of the ultrasonic wave. In addition, because the protrusion 52c deforms preferentially, plastic flow in the bonding portion is accelerated and thus the crystal grains in the portion around the protrusion can be made finer, so that the bonding portion becomes stronger. The parts bonded together in such a stronger fashion due to the protrusion 52c, can be observed as a state of the fracture surface after bonding, a state of the grain size after cross-section polishing, or the like. Meanwhile, in order to achieve a large area of the strong bonding face by use of deformation of the protrusion 52c, it is preferable that the surface shape of the surface to be bonded of the electrode terminal 3 be planar.

Figure 3A:
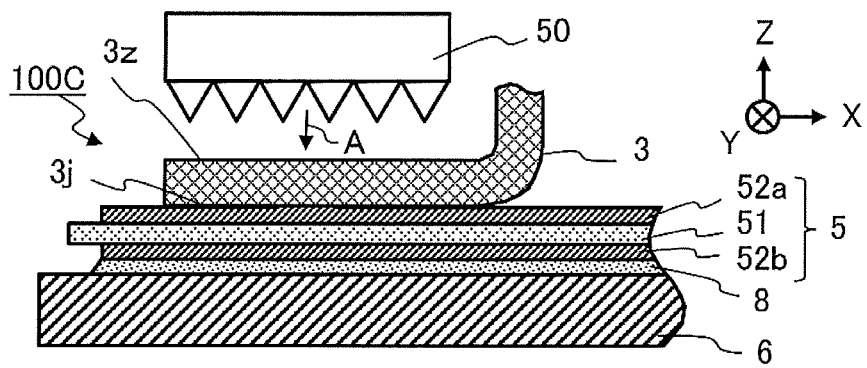
FIG. 3A, FIG. 3B and FIG. 3C are cross-sectional views of a region where a conductor pattern and an electrode pattern are bonded together, at respective steps, for illustrating a manufacturing method for a power semiconductor device as a comparative example.
Figure 3B:
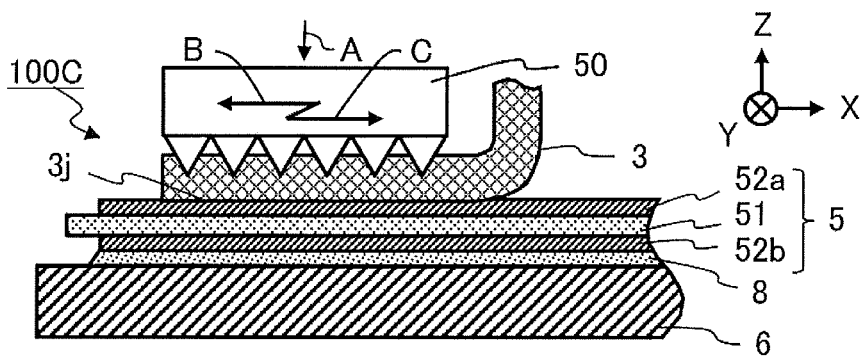
Figure 3C:
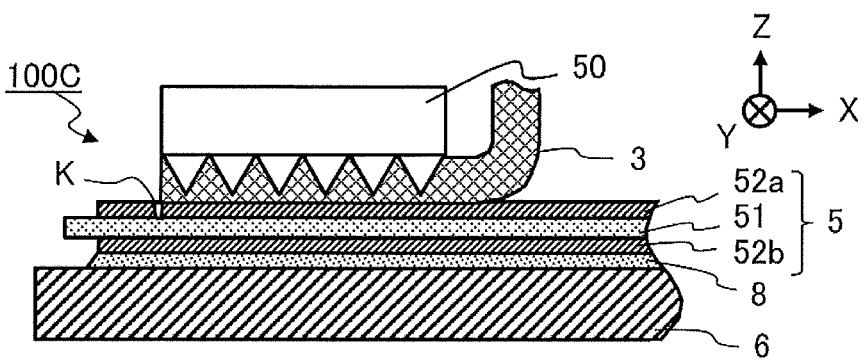

FIG. 3A, FIG. 3B and FIG. 3C are diagrams showing manufacturing steps for a main part of a conventional power semiconductor device 1000. In the case of the conventional power semiconductor device 1000, as shown in FIG. 3A, the surface 3j to be bonded is fully laid on the conductor pattern 52a, because the protrusion 52c according to Embodiment 1 is not provided on the conductor pattern 52a.

Then, as shown in FIG. 3B, due to the applied pressure and the vibration at the time of bonding using ultrasonic bonding, the contacting faces of the conductor pattern 52a and the electrode terminal 3 rub each other, so that the bonding-inhibiting film such as an oxide film or the like, or something like that, which covers each of the contacting faces, is removed; however, when ultrasonic bonding starts with the electrode terminal 3 laid on the conductor pattern 52a provided with no protrusion 52c, both ends of the surface to be bonded 3j of the electrode 3 are bonded. Even though the pressure and the ultrasonic vibration are applied by the ultrasonic horn 50, such bonding portions will never expand any more, and the stress by the applied pressure will never decrease. The oxide film or the like removed at that time is not only discharged to the outer side of the electrode terminal 3 but also transferred to the inner side of the electrode terminal 3. When the both ends of the terminal are bonded, the oxide film or the like transferred to the center portion of the electrode terminal 3 can not be removed to the outer side of the electrode terminal 3 and remains between the contacting faces and thus, their corresponding portions are not bonded together to thereby provide a non-bonded region. Thus, the resultant bonded area decreases correspondingly, and this constitutes a factor of decreasing the bonding strength or the reliability.

Further, when this state continues for a long time, such a case may arises that, as shown FIG. 3C, a crack K occurs in the bonding portion between the conductor pattern 52a and the electrode terminal 3, so that the conductor pattern 52a is broken. In the semiconductor device, at the time of operation, the current that flows in the semiconductor element is flowing in the conductor pattern 52a through the bonding portion from the electrode terminal 3, and thus, there is a risk that if the conductor pattern 52a is broken, this may result in no current flowing in the semiconductor device. Further, although it is common that the conductor pattern 52a is formed integrally with an insulating layer so as to prevent a current from flowing on the heat dissipation surface of the semiconductor device, if the conductor pattern 52a is broken, the insulating layer formed integrally with that conductor pattern will also be broken at the same time. This causes a risk of not ensuring the insulation property of the product, and is thus very dangerous. In order to avoid these risks, there is a method of reducing the load and the amplitude and shortening the application time, that are conditions of applying the ultrasonic wave; however, this constitutes a factor of decreasing the bonding strength between the electrode terminal 3 and the conductor pattern 52a at the same time, thus causing a disadvantage of narrowing a margin of the bonding process.

In contrast, in accordance with the power semiconductor device 100 according to Embodiment 1 of the invention, because the protrusion 52c is provided in the area of the surface of the conductor pattern 52a, that is to be ultrasonically bonded to the surface to be bonded 3j of the electrode terminal 3, the removed oxide film or the like is discharged to the outer side of the electrode terminal 3 in accordance with the deformation of the protrusion 52c, and will never remain in the bonding portion. Thus, bonding is established up to the inner side of the surface to be bonded 3j of the electrode terminal 3, so that, as compared with the conventional power semiconductor device 100C, it is possible to make the bonded area larger. When the bonded area becomes larger, the electric resistance of the bonding portion becomes smaller correspondingly, so that heat generation of the electrode terminal 3 due to the power-on resistance is suppressed. Thus, as compared with the case where the bonded area is smaller, it is possible to cause a larger current to flow. In addition, because the protrusion 52c deforms preferentially, plastic flow in the bonding portion is accelerated and thus, as compared with the conventional ultrasonically-bonded bonding portion, the crystal grains in the portion around the protrusion can be made finer. Accordingly, the bonding portion is less likely to be broken than the conventional ultrasonically-bonded bonding portion, so that it is possible to achieve a highly reliable bonding portion.

Further, as the bonded area becomes larger, the bonding portion becomes harder to be broken against: a thermal stress that is produced in the bonding portion due to a temperature change caused by the operation of the semiconductor device and due to a difference in linear expansion coefficient between the parts; and also a tensile stress to which the bonding portion is subjected, due to a deformation of the semiconductor device as a whole caused by the temperature change, so that a highly reliable power semiconductor device can be achieved. Thus, it is possible to achieve a power semiconductor device that can deal with a larger current and has a higher reliability, than those by the conventional bonding between the electrode terminal 3 and the conductor pattern 52a.

It is noted that, at the time of ultrasonic bonding, although the protrusion 52c deforms when pressurized by the ultrasonic horn 50, from the shape in FIG. 2A toward sides of the conductor pattern 52 (in the z-direction), if the height of the protrusion 52c is higher than that corresponding to the deformed volume, bonding will be accomplished only between the protrusion 52c and the electrode terminal 3. Thus, there is a possibility that the conductor pattern 52a and the electrode terminal 3 do not make contact with each other, so that the bonded area does not expand and thus, the resultant bonded area becomes smaller relative to the surface to be bonded 3j of the electrode terminal 3. In addition, there is a possibility that stress concentration occurs due to the applied pressure and the vibration in the root portion of the protrusion 52c, so that the protrusion 52c and the conductor pattern 52a are broken. Accordingly, it is preferable that the height of the protrusion 52c be set lower than that corresponding to a deformable volume for the protrusion 52c due to the applied pressure. For example, in the case where the electrode terminal 3, the conductor pattern 52a and the protrusion 52c are commonly formed of copper, it is preferable that the height of the protrusion 52c beset to about 0.01 to 0.2 mm. In the case where the electrode terminal 3 is formed of copper, and the conductor pattern 52a and the protrusion 52c are formed of aluminum, it is preferable that the height of the protrusion 52c beset to about 0.01 to 0.4 mm. Meanwhile, as the area of the head of the protrusion 52c becomes larger, the applied pressure per unit area by the ultrasonic horn 50 becomes smaller, so that the deformed volume of the protrusion 52c becomes smaller. Although the area of the head of the protrusion 52c is required to be smaller than the surface to be bonded 3j of the electrode terminal 3, in the case, for example, where the electrode terminal 3, the conductor pattern 52a and the protrusion 52c are commonly formed of copper, it is preferable that the area of the head of the protrusion 52c be set to about 10 mm$^2$ or less. In the case where the electrode terminal 3 is formed of copper, and the conductor pattern 52a and the protrusion 52c are formed of aluminum, it is preferable that the area of the head of the protrusion 52c be set to about 15 mm$^2$ or less.

Further, when the Vickers hardness (hereinafter, "hardness") of the protrusion 52 is set lower than that of the electrode terminal 3, the protrusion 52c will deform even by a smaller applied pressure. This makes it possible to further enhance the effect of preventing breakage of the conductor pattern due to stress concentration, and increasing the bonding strength, so that it is preferable that the hardness of the protrusion 52c be set lower than that of the electrode terminal 3.

Figure 4A:
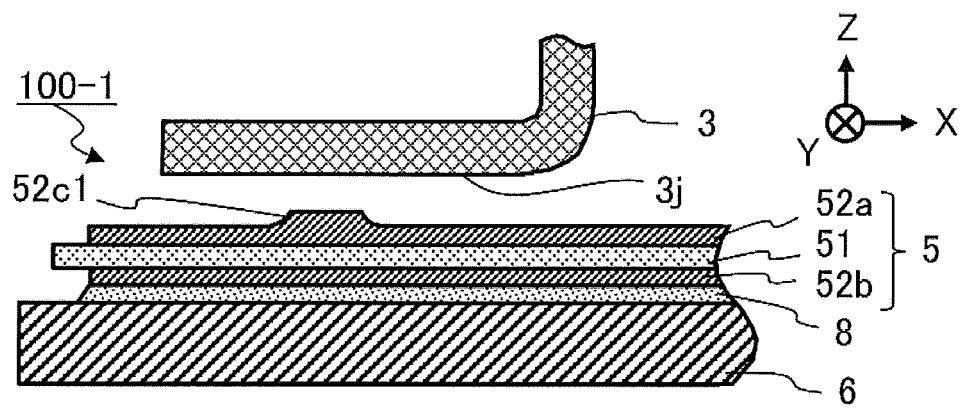
FIG. 4A and FIG. 4B are a partial cross-sectional view and a top view showing an example of a shape of a protrusion for the power semiconductor device according to Embodiment 1 of the invention.
Figure 4B:
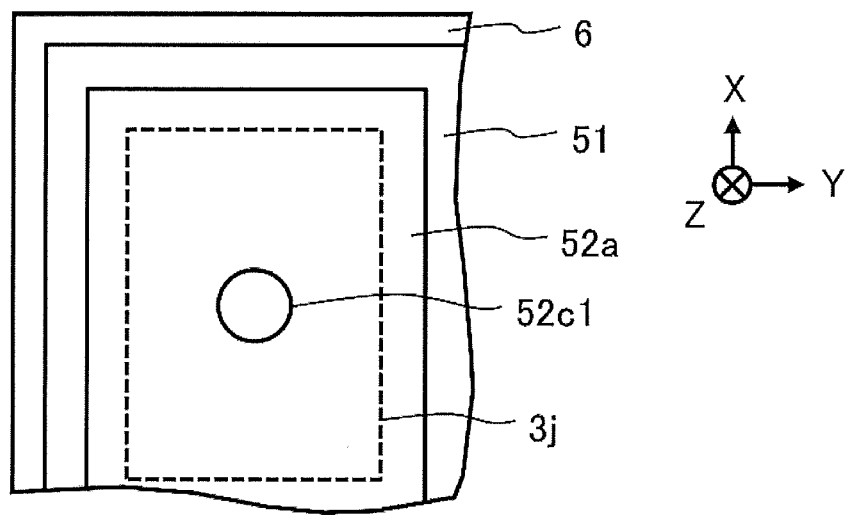
Figure 5A:
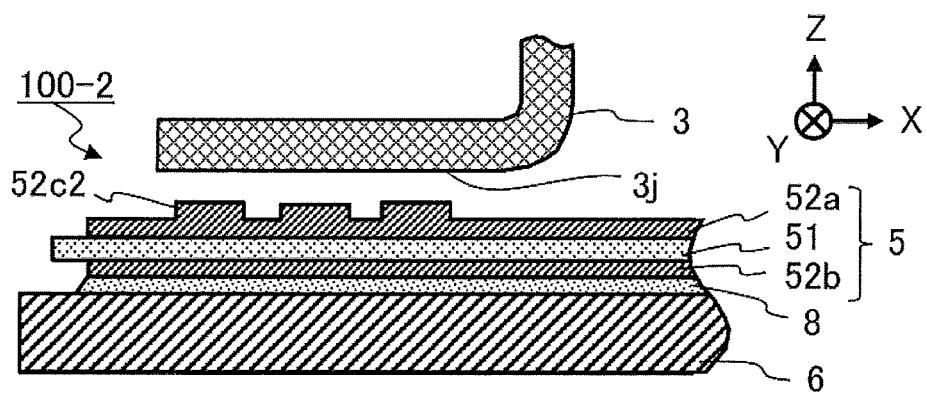
FIG. 5A and FIG. 5B are a partial cross-sectional view and a top view showing an example of a shape of a protrusion for the power semiconductor device according to Embodiment 1 of the invention.
Figure 5B:
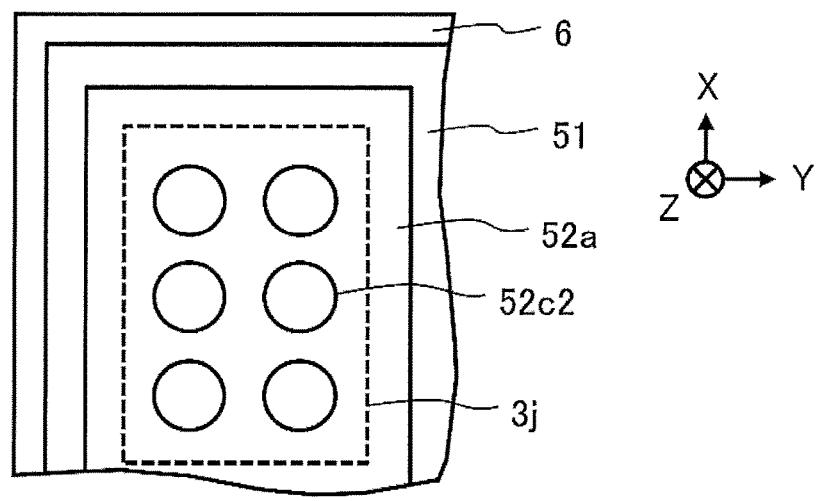

Furthermore, with respect to the shape of the protrusion 52c, so long as it satisfies the above functions, it may be, other than the cylindrical shape, any shape such as, a hemispherical shape, a rectangular column shape, a conical shape, a truncated pyramid shape, or the like; however, it is preferable to be a protrusion 52c1 with an edge-rounded shape as shown in FIG. 4A and FIG. 4B, for example. When it is so shaped, it is possible to prevent the protrusion 52c1 and the conductor pattern 52a from being broken due to stress concentration in the root portion of the protrusion 52c caused by the applied pressure and the vibration by the ultrasonic horn 50 at the time of bonding. Further, as shown in FIG. 5A and FIG. 5B, when plural protrusions 52c2 are given as the protrusion provided in the area of the surface of the conductor pattern 52a to be bonded to the surface to be bonded 3j, it is possible to restrict the bonding strength from decreasing due to one-side contact between the conductor pattern 52a and the electrode terminal 3 according to an inclination of the ceramic board 5 or the electrode terminal 3.

Figure 6A:
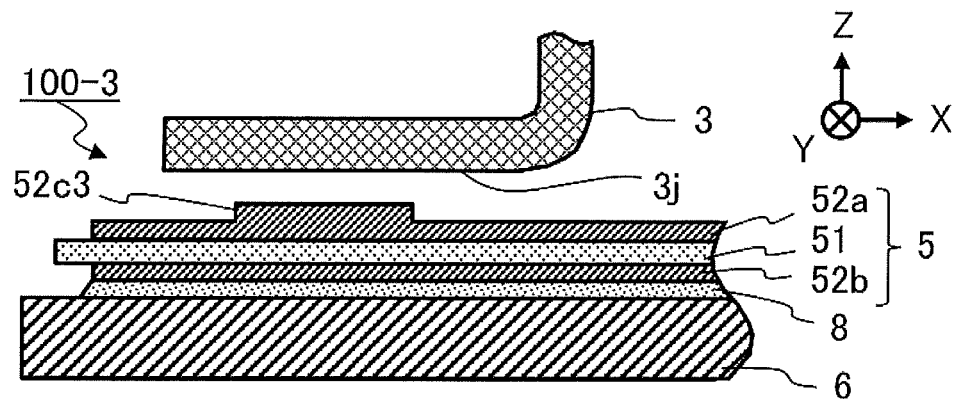
FIG. 6A and FIG. 6B are a partial cross-sectional view and a top view showing an example of a shape of a protrusion for the power semiconductor device according to Embodiment 1 of the invention.
Figure 6B:
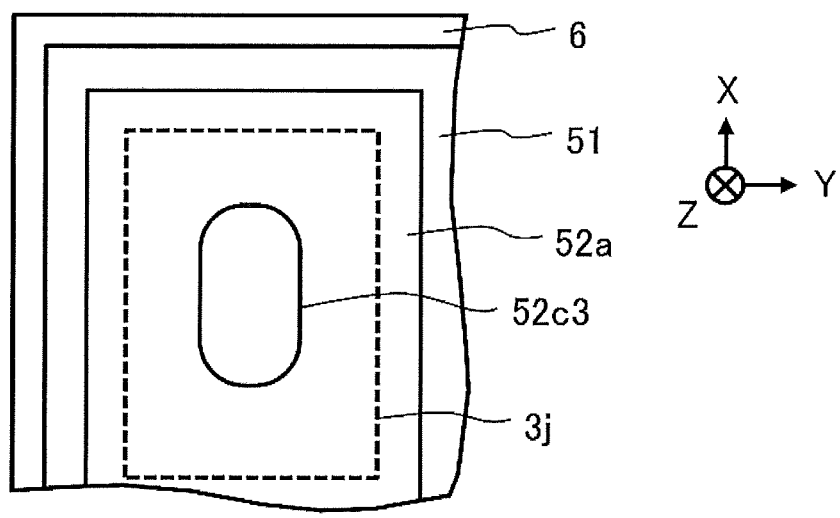

Further, when the protrusion 52c is going to deform due to the applied pressure and the vibration by the ultrasonic horn 50 at the time of bonding, it will deform largely in the vibration directions of the ultrasonic horn 50, so that, when the protrusion 52c is provided with, for example, a circular shape, the region where the effect is developed by the protrusion 52c becomes larger in the vibration directions than in the other. For that reason, as shown in FIG. 6A and FIG. 6B, a protrusion 52c3 is provided in which the shape of the projection is beforehand made longer in the direction that is perpendicular to the vibration directions, than in the other, so that the region where the effect of increasing the bonding strength is developed by the protrusion, can be expanded efficiently. For example, when the vibration directions correspond to the y-direction, it is preferable that the ratio of the lengths at the head of the protrusion 52c3 be set as two in the x-direction and one in the y-direction.

Figure 7A:
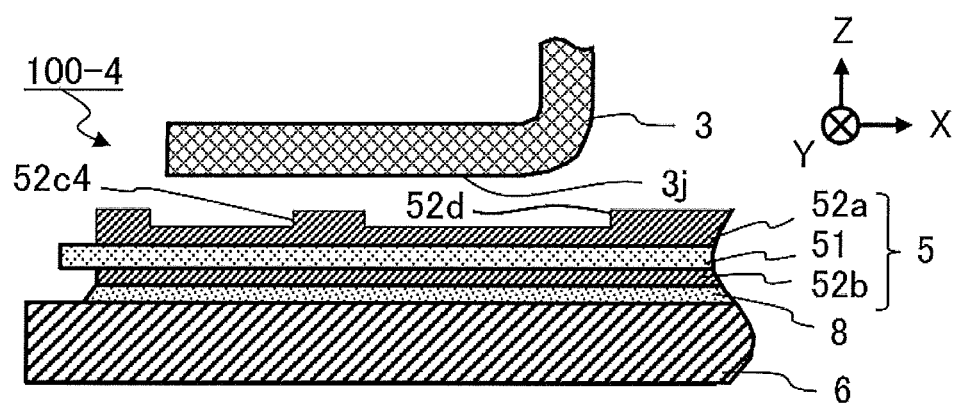
FIG. 7A and FIG. 7B are a partial cross-sectional view and a top view showing an example of a shape of a protrusion for the power semiconductor device according to Embodiment 1 of the invention.
Figure 7B:
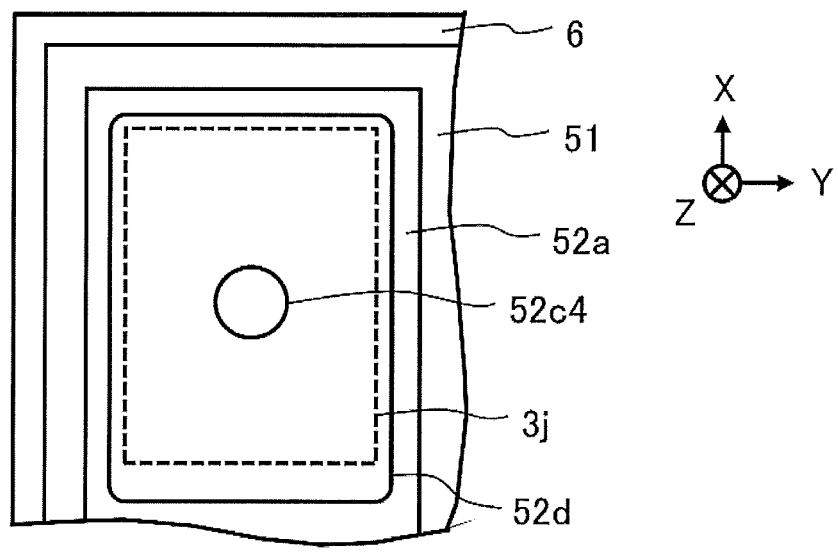

Further, as shown in FIG. 7A and FIG. 7B, a protrusion 52c4 may be formed by depressing a portion of the conductor pattern 52a around that protrusion. At this time, in order to develop the effect by the protrusion 52c4, it is required to make the circumference of the depressed portion larger than the periphery of the electrode terminal 3. Besides, it is preferable that the periphery of the electrode terminal 3 be made equal to or smaller than a periphery developed by the electrode terminal 3 when it is placed at every limited position with respect to the allowable displacement amount relative to the protrusion 52c4. This makes it possible to cause positioning of the terminal before bonding, at the time of appearance inspection.

Figure 8A:
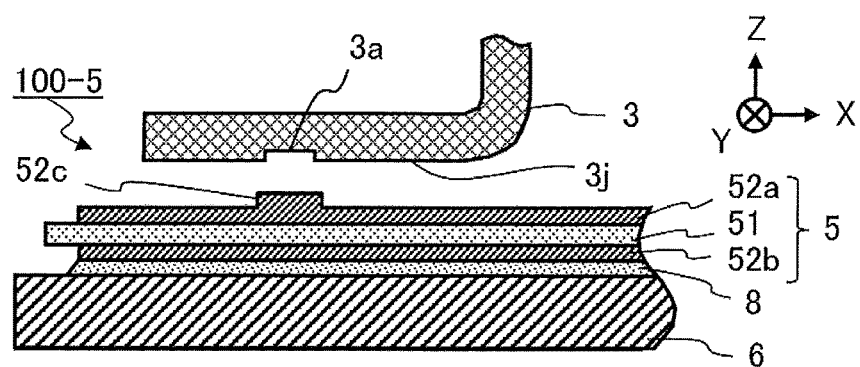
FIG. 8A and FIG. 8B are a partial cross-sectional view and a top view showing an example of a shape of a protrusion for the power semiconductor device according to Embodiment 1 of the invention.
Figure 8B:
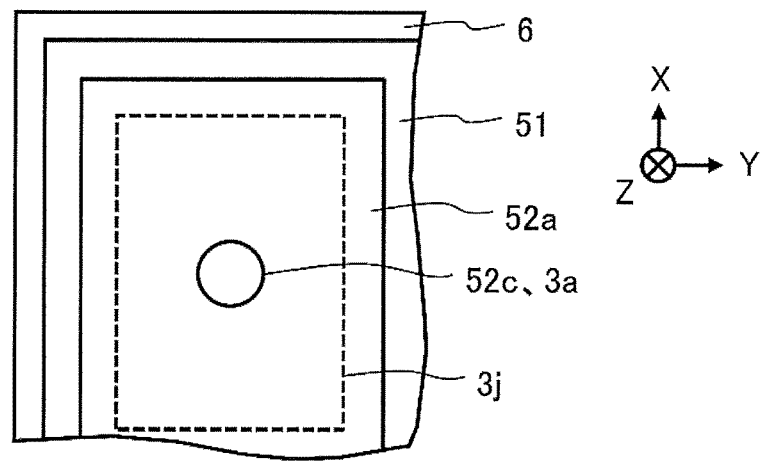

Furthermore, as shown in FIG. 8A and FIG. 8B, when a recess 3a that is smaller than the protrusion 52c is provided on the electrode terminal 3 at its position facing the protrusion 52c, it is possible to enhance the effect of increasing the bonding strength, because of a swaging effect due to the applied pressure by the ultrasonic horn 50. Further, it is additionally possible to cause positioning of the terminal when the recess 3a is replaced with a through-hole.

Figure 9A:
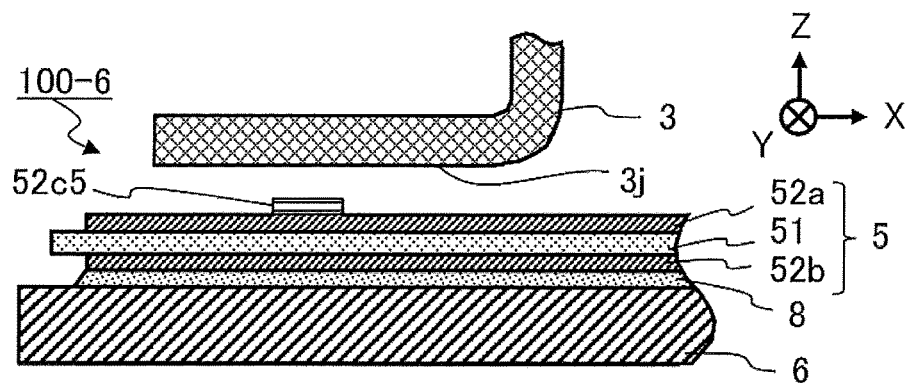
FIG. 9A and FIG. 9B are a partial cross-sectional view and a top view showing an example of a shape of a protrusion for the power semiconductor device according to Embodiment 1 of the invention.
Figure 9B:
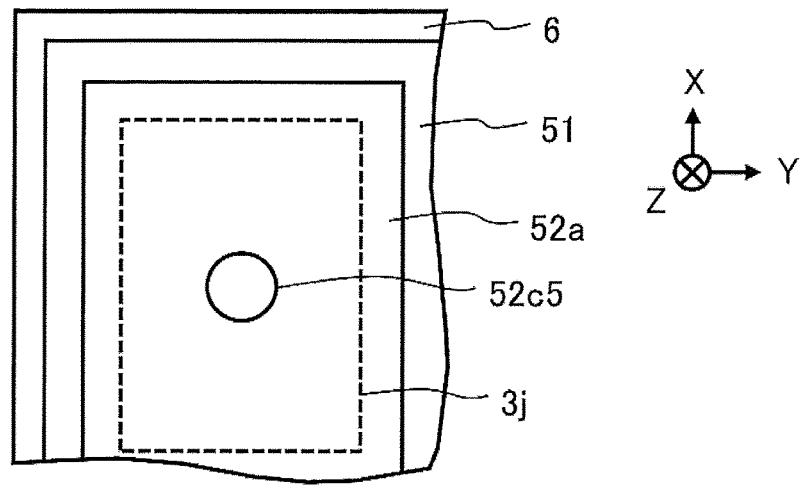
Figure 10A:
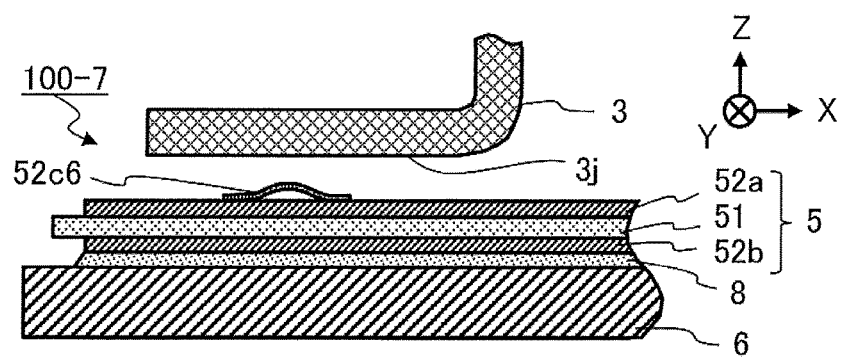
FIG. 10A and FIG. 10B are a partial cross-sectional view and a top view showing an example of a shape of a protrusion for the power semiconductor device according to Embodiment 1 of the invention.
Figure 10B:
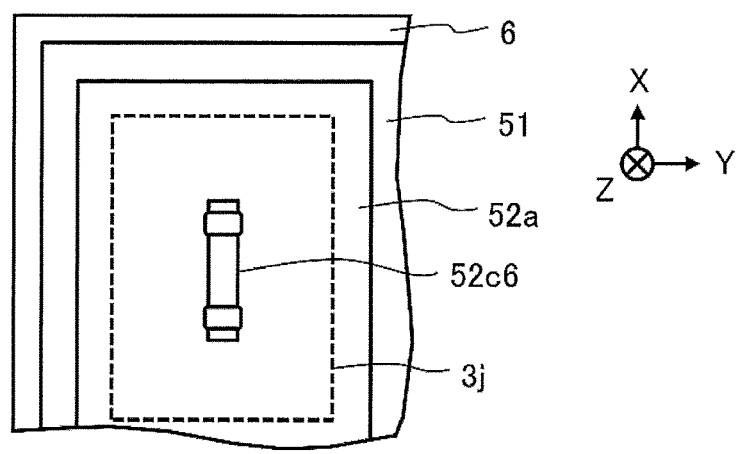
Figure 11A:
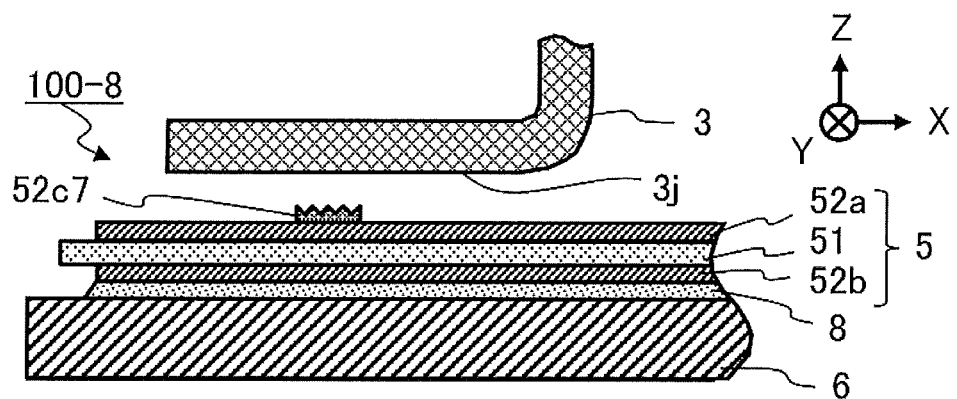
FIG. 11A and FIG. 11B are a partial cross-sectional view and a top view showing an example of a shape of a protrusion for the power semiconductor device according to Embodiment 1 of the invention.
Figure 11B:
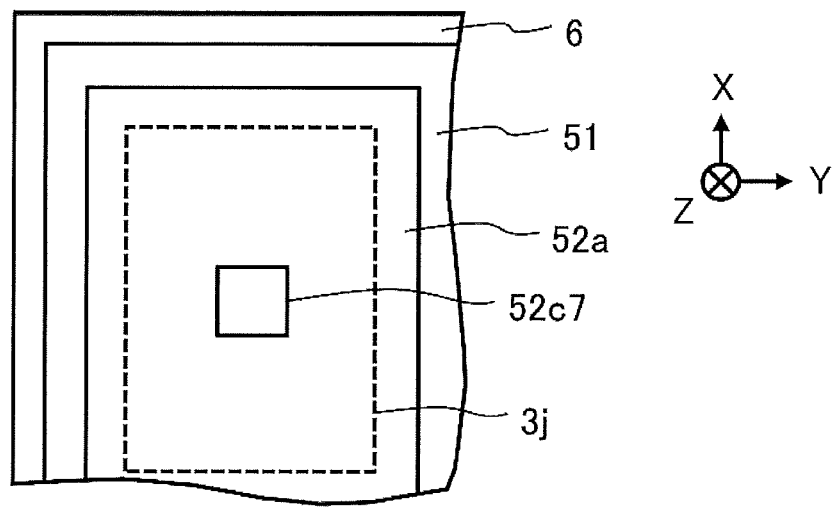

In addition, the protrusion 52c may be formed of a member that is different to that of the conductor pattern 52a. For example, as shown in FIG. 9A and FIG. 9B, when a Cu wire or a Cu ribbon is bonded onto the conductor pattern 52a in a state forming a loop, a protrusion 52c5 can be formed more easily than by processing the conductor pattern 52a, and not only that, the loop portion will preferentially deform at the time of bonding. Thus, the damage imposed on the conductor pattern 52a and the ceramic base member 51 can be reduced to more extent. Likewise, as shown in FIG. 10A and FIG. 10B, when a protrusion 52c6 having a density lower than that of the conductor pattern 52a is formed by thermal spraying, the protrusion 52c6 can be formed more easily than by processing the conductor pattern 52a, and not only that, the protrusion 52c6 having the lower density will preferentially deform at the time of bonding. Thus, the damage imposed on the conductor pattern 52a and the ceramic base member 51 can be reduced to more extent. Instead, a thin Cu foil may be bonded beforehand onto the conductor pattern 52a. On this occasion, when the Cu foil is, like the electrode terminal 3, bonded by ultrasonic bonding, the bonding process of the Cu foil can be shortened, and in addition, as shown in FIG. 11A and FIG. 11B, the shape of the head of an ultrasonic horn 50 is transferred to the Cu foil. Thus, it is possible to easily achieve an effect that is the same as that in the case where the plural protrusions 52c2 are provided as shown in FIG. 5. The applied pressure necessary for bonding the Cu foil is lower than the applied pressure necessary for bonding the electrode terminal 3, and thus, there is no damage imposed on the conductor pattern 52a and the ceramic base member 51 at the time the Cu foil is ultrasonically bonded onto the conductor pattern 52a.

As described above, in accordance with the manufacturing method for the power semiconductor device 100 according to Embodiment 1 of the invention, it comprises: a step of laying the electrode terminal 3 on the protrusion 52c that is provided on the conductor pattern 52a placed on the circuit-face side of the ceramic board 5 so that the center portion of the surface to be bonded 3j of the electrode terminal makes contact with the head portion of the protrusion; and a step of pressurizing and ultrasonically vibrating the surface 3z opposite to the surface to be bonded 3j, of the electrode terminal 3, using the ultrasonic horn 50, to thereby bond the electrode terminal to the conductor pattern 52a. Thus, the bonded area increases as bonding proceeds, and in accordance therewith, the stress due to the applied pressure decreases. Thus, it is possible to prevent the conductor pattern 52a and the ceramic base member 51 from being broken due to stress concentration caused by the applied pressure at the time of application of the ultrasonic wave.

Further, the oxide film or the like placed on each of the surfaces of the electrode terminal 3 and the protrusion 52c is discharged to the outer side of the electrode terminal 3 in accordance with the deformation of the protrusion 52c, and will never remain in the bonding portion. Thus, bonding is established up to the inner side of the surface to be bonded 3j of the electrode terminal 3, so that, as compared with the conventional power semiconductor device 100C, it is possible to make the bonded area larger. When the bonded area becomes larger, the electric resistance of the bonding portion becomes smaller correspondingly, so that heat generation of the electrode terminal 3 due to the power-on resistance is suppressed. Thus, as compared with the case where the bonded area is smaller, it is possible to cause a larger current to flow.

Further, as the bonded area becomes larger, the bonding portion becomes harder to be broken against: a thermal stress that is produced in the bonding portion due to a temperature change caused by the operation of the semiconductor device and due to a difference in linear expansion coefficient between the parts; and also a tensile stress to which the bonding portion is subjected, due to a deformation of the semiconductor device as a whole caused by the temperature change, so that a highly reliable power semiconductor device can be achieved. Thus, it is possible to achieve a power semiconductor device that can deal with a larger current and has a higher reliability, than those by the conventional bonding between the electrode terminal 3 and the conductor pattern 52a.

Embodiment 2

In Embodiment 1, a case has been shown where ultrasonic bonding is used for bonding the conductor pattern 52a of the ceramic board 5 and the electrode terminal 3 together, whereas, in Embodiment 2, a case will be described where ultrasonic bonding is used for bonding a front-surface electrode of a power semiconductor element and the electrode terminal 3 together.

Figure 12A:
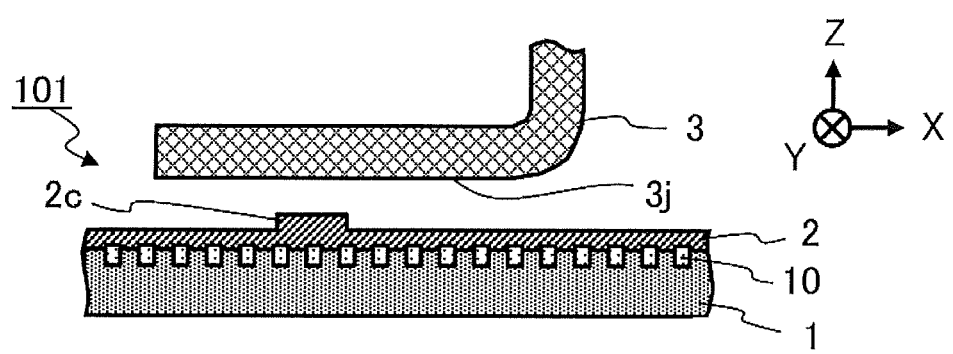
FIG. 12A and FIG. 12B are a partial cross-sectional view and a top view for illustrating a configuration before bonding of a main part of a power semiconductor device according to Embodiment 2 of the invention.
Figure 12B:
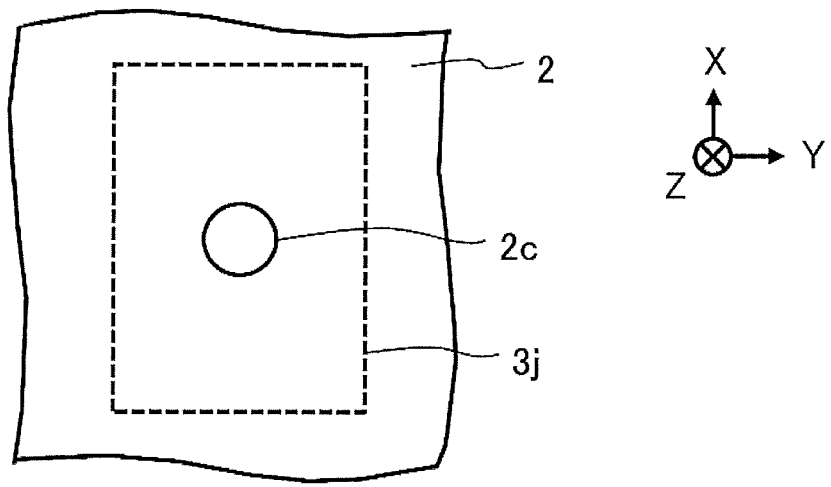

FIG. 12A and FIG. 12B are a partial cross-sectional view and a top view, respectively, showing the configuration before bonding of a main part of a power semiconductor device 101 according to Embodiment 2 of the invention. As shown in FIG. 12A and FIG. 12B, the power semiconductor device 101 according to Embodiment 2 of the invention includes: a front-surface electrode 2 as an electrode layer formed on a surface of the power semiconductor element 1; the electrode terminal 3; and so on. Under the front-surface electrode 2, transistors 10 are formed.

The power semiconductor element 1 is a power semiconductor element that constitutes an inverter, a converter, or the like. A surface on the back-surface side of the power semiconductor element 1 is, though not illustrated, bonded by a solder onto the conductor pattern 52a of the ceramic board 5. Although the power semiconductor element 1 may be configured with at least one semiconductor element, such a power semiconductor element is preferable in which an IGBT (Insulated Gate Bipolar Transistor) or a MOSFET (Metal-Oxide-Semiconductor Field-Effect Transistor) is connected in reverse parallel with a diode. As the material of the power semiconductor element 1, Si was used. Note that, with respect to the material, the power semiconductor element 1 is not limited to that formed of Si, and may be formed of a wide bandgap semiconductor that is wider in bandgap than Si. Examples of the wide bandgap semiconductor include, for example, SiC, GaN, diamond and the like. Since the power semiconductor device in which SiC is used for its power semiconductor element is operable at a higher temperature, a temperature change in the semiconductor device becomes larger, so that the thermal stress and the tensile stress produced in the bonding portion tend to become larger. Thus, the power semiconductor device using SiC is favorable because the advantage of the invention will become more effective. As compared with the case of Si, in the case of Si, the area of the front-surface electrode 2 with respect to the rated current of the chip is smaller, so that, as compared with the case of Si, a higher density wiring technology is required. Thus, according the power semiconductor device using SiC, the advantage of the invention in which the electrode terminal 3 is ultrasonically bonded to the front-surface electrode 2 to thereby establish bonding over a large area at one time, will become more effective.

The front-surface electrode 2 is a film of a metal for electrode wiring, which is formed on the surface of the power semiconductor element 1. As the material of the front-surface electrode 2, Al is usually used; however, an Al alloy, Cu, a Cu alloy or the like may be used in some cases. As the case may be, it is provided as laminated layers of metals selected from among Ti, Mo, Ni, Au and the like; however, in any of these cases, it is possible to achieve a similar effect. The material of the front-surface electrode 2 in Embodiment 2 is Al. Further, like in Embodiment 1, at least one protrusion 2c is provided in the area of the surface of the front-surface electrode 2, to be ultrasonically bonded at least to the surface to be bonded 3j of the electrode terminal 3. The protrusion 2c in Embodiment 2 is formed simultaneously at the time of forming the front-surface electrode 2, and has a head portion whose shape is a circular shape with a diameter $\phi$ of 1.0 mm, and has a height of 0.05 mm. The other configuration is similar to that in the power semiconductor device 100 in Embodiment 1, so that its description is omitted here.

As similar to the conductor pattern 52a described in Embodiment 1, in the power semiconductor element 1, it is necessary to flow a current required to cause the power semiconductor device to operate, and the same also applies to the case where the electrode terminal 3 is ultrasonically bonded onto the front-surface electrode 2 of the power semiconductor element 1. Further, according to ultrasonic bonding, as the member becomes thicker in plate thickness and becomes harder, the energy required for that bonding becomes larger. Thus, as compared with ultrasonic bonding for an Al wire or the like, it is necessary to increase a condition for bonding, such as the load, the bonding time, the amplitude, etc.

When the conventional semiconductor device is used, with the conditions for bonding that are necessary to achieve a sufficient bonded area at the time of ultrasonic bonding, the actual thickness of the front-surface electrode is too thin relative to a deformable volume for the front-surface electrode 2. Thus, due to the applied pressure and the ultrasonic vibration by the ultrasonic horn 50, the front-surface electrode 2 deforms together with the electrode terminal 3 and is partly removed, so that the transistor 10 formed under the electrode is broken. When deformation further proceeds, the electrode terminal 3 makes contact with the power semiconductor element 1, so that the power semiconductor element 1 is broken.

In contrast, in accordance with the power semiconductor device 101 according to Embodiment 2 of the invention, as described previously, the protrusion 2c is provided in the area of the surface of the front-surface electrode 2, to be ultrasonically bonded to the surface to be bonded 3j of the electrode terminal 3. On this occasion, the protrusion 2c will deforms preferentially due to the applied pressure and the ultrasonic vibration by the ultrasonic horn 50, and this makes it possible to restrict the front-surface electrode 2 from deforming due to the applied pressure and the ultrasonic vibration by the ultrasonic horn 50. Thus, it is possible to prevent the transistors 10 and the power semiconductor element 1 that are formed under the electrode, from being broken.

As described above, in accordance with the manufacturing method for the power semiconductor device 101 according to Embodiment 2 of the invention, it comprises: a step of laying the electrode terminal 3 on the protrusion 2c that is provided on the front-surface electrode 2 of the power semiconductor element 1 so that the center portion of the surface to be bonded 3j of the electrode terminal makes contact with the head portion of the protrusion; and a step of pressurizing and ultrasonically vibrating the surface 3z opposite to the surface to be bonded 3j, of the electrode terminal 3, using the ultrasonic horn 50, to thereby bond the electrode terminal to the front-surface electrode 2. Thus, it is possible to achieve, in addition to the effect of improving the bonding property in Embodiment 1, an effect of restricting the front-surface electrode 2 from deforming due to the applied pressure and the ultrasonic vibration by the ultrasonic horn 50, to thereby prevent the transistors and the power semiconductor element that are formed under the electrode, from being broken.

Further, as the shape of the protrusion 2c, when such a shape that is shown in each of FIG. 4 to FIG. 11 of Embodiment 1 is applied, it is possible to achieve each of effects similar to those in Embodiment 1.

It should be noted that unlimited combination of the respective embodiments and an appropriate modification/omission in the embodiments may be made in the present invention without departing from the scope of the invention.

DESCRIPTION OF REFERENCE NUMERALS AND SIGNS

1: power semiconductor element, 2: front-surface electrode, 2c: protrusion, 3: electrode terminal, 3j: surface to be bonded, 50: ultrasonic horn, 51: ceramic base member, 52a: conductor pattern, 52c, 52c1, 52c2, 52c3, 52c4, 52c5, 52c6, 52c7: protrusion, 52d: end of depressed portion, 100, 100-1, 100-2, 100-3, 100-4, 100-5, 100-6, 100-7, 100-8, 101: power semiconductor device.

The invention claimed is:

1. A manufacturing method of a power semiconductor device, comprising:
a step in which an electrode terminal is laid on a protrusion that is provided on an electrode layer and that has a hardness lower than that of the electrode terminal so that a part of a surface to be bonded that is placed on a back-surface side of the electrode terminal makes contact with a head portion of the protrusion; and
a step in which the electrode terminal and the electrode layer are bonded together in such a manner that the protrusion deforms preferentially due to a pressure and ultrasonic vibration applied thereto by an ultrasonic horn from a front-surface side of the electrode terminal.

2. A power semiconductor device which is manufactured by the manufacturing method of a power semiconductor device according to claim 1.

3. The manufacturing method of a power semiconductor device according to claim 1, wherein the electrode terminal is bonded to the protrusion and the electrode layer.

4. A power semiconductor device which is manufactured by the manufacturing method of a power semiconductor device according to claim 3.

5. The manufacturing method of a power semiconductor device according to claim 1, wherein the electrode layer is a conductor pattern on an insulating board.

6. A power semiconductor device which is manufactured by the manufacturing method of a power semiconductor device according to claim 5.

7. The manufacturing method of a power semiconductor device according to claim 1, wherein the electrode layer is a front-surface electrode on a power semiconductor element.

8. A power semiconductor device which is manufactured by the manufacturing method of a power semiconductor device according to claim 7.

9. The manufacturing method of a power semiconductor device according to claim 1, wherein the protrusion comprises a material which is different to that of the electrode layer.

10. A power semiconductor device which is manufactured by the manufacturing method of a power semiconductor device according to claim 9.

11. The manufacturing method of a power semiconductor device according to claim 1, wherein the head portion of the protrusion has a shape whose width in a direction perpendicular to a direction of the ultrasonic vibration is wider than that in another direction.

12. A power semiconductor device which is manufactured by the manufacturing method of a power semiconductor device according to claim 11.

13. The manufacturing method of a power semiconductor device according to claim 1, wherein a portion around the protrusion is shaped as a depressed portion in conformity with the electrode terminal.

14. A power semiconductor device which is manufactured by the manufacturing method of a power semiconductor device according to claim 13.

15. The manufacturing method of a power semiconductor device according to claim 1, wherein the protrusion has a loop shape by use of a linear or plate-like member.

16. A power semiconductor device which is manufactured by the manufacturing method of a power semiconductor device according to claim 15.

17. The manufacturing method of a power semiconductor device according to claim 1, wherein the protrusion is formed to have a density lower than that of the electrode layer.

18. A power semiconductor device which is manufactured by the manufacturing method of a power semiconductor device according to claim 17.

19. The manufacturing method of a power semiconductor device according to claim 1, wherein the electrode terminal has, at its position where it is laid on the head portion of the protrusion, a recess or a through-hole.

* * * * *